United States Patent
Bi et al.

(10) Patent No.: US 9,196,557 B1
(45) Date of Patent: Nov. 24, 2015

(54) PROTECTIVE PACKAGING FOR INTEGRATED CIRCUIT DEVICE

(71) Applicants: Jianshe Bi, Tianjin (CN); Lanping Bai, Tianjin (CN); Quan Chen, Tianjin (CN); Liping Guo, Tianjin (CN); Yanbo Xu, Tianjin (CN)

(72) Inventors: Jianshe Bi, Tianjin (CN); Lanping Bai, Tianjin (CN); Quan Chen, Tianjin (CN); Liping Guo, Tianjin (CN); Yanbo Xu, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/554,058

(22) Filed: Nov. 26, 2014

(30) Foreign Application Priority Data

May 16, 2014 (CN) .......................... 2014 1 0297996

(51) Int. Cl.
*H01L 23/495* (2006.01)
*H01L 23/31* (2006.01)
*H01L 23/48* (2006.01)
*H01L 23/00* (2006.01)
*H01L 21/56* (2006.01)
*H01L 21/82* (2006.01)

(52) U.S. Cl.
CPC .......... *H01L 23/3107* (2013.01); *H01L 21/565* (2013.01); *H01L 21/82* (2013.01); *H01L 23/481* (2013.01); *H01L 24/16* (2013.01)

(58) Field of Classification Search
CPC .................................................... H01L 23/3107
USPC ........................................................ 257/666
See application file for complete search history.

(56) References Cited

U.S. PATENT DOCUMENTS

| 6,426,564 | B1 | 7/2002 | Ball | |
|---|---|---|---|---|
| 7,113,250 | B2 | 9/2006 | Jacobsen | |
| 7,320,903 | B2 | 1/2008 | Wright | |
| 7,485,562 | B2 | 2/2009 | Chua | |
| 8,563,357 | B2 | 10/2013 | Lim | |
| 2004/0016939 | A1* | 1/2004 | Akiba | H01L 21/565 257/126 |
| 2006/0244117 | A1* | 11/2006 | Karnezos | H01L 24/97 257/678 |
| 2013/0140664 | A1 | 6/2013 | Lo | |

* cited by examiner

*Primary Examiner* — Anthony Ho
(74) *Attorney, Agent, or Firm* — Charles Bergere (57) ABSTRACT

A method for packaging an integrated circuit (IC) device in which conventional manufacturing steps of mechanically bonding a die to a corresponding interconnecting substrate, wire bonding the die, and encapsulating the die in a protective shell are replaced by a single manufacturing step that includes thermally treating an appropriate assembly of parts to both form proper electrical connections for the die in the resulting IC package and cause the molding compound(s) to encapsulate the die in a protective enclosure.

5 Claims, 8 Drawing Sheets

PROTECTIVE PACKAGING FOR INTEGRATED CIRCUIT DEVICE

BACKGROUND OF THE INVENTION

The present invention relates to integrated circuit (IC) packaging, and more particularly, to protective encapsulation of a die used in a ball grid array (BGA) or a similar IC package.

The most readily available form of semiconductor die products are termed "bare die." Typically, such bare dies are produced in relatively large batches using wafers of electronics-grade silicon or other suitable semiconductor material(s) through a multi-step sequence of photolithographic and chemical processing steps, during which integrated circuits are gradually created on the wafer. Each wafer is then cut ("diced") into many pieces (dies), each containing a respective copy of the functional circuit that is being fabricated.

Many IC manufacturers purchase or fabricate bare dies and then package them in a particular manner to produce packaged IC devices that meet customer specifications. A conventional bare-die packaging process may include the steps of (i) mounting a die on an interconnecting substrate, such as a redistribution layer (RDL), an interposer, or a lead frame, and bonding or mechanically attaching the die to the interconnecting substrate; (iii) wire bonding the die to electrically connect it to the interconnecting substrate; and (iv) encapsulating the die in a protective molding compound.

In the bare-die packaging process, the wire bonding and encapsulating steps are substantially the rate-limiting steps of the manufacturing process. As such, improvements to the conventional bare-die packaging processes are desirable, e.g., to increase the throughput of the production line.

BRIEF DESCRIPTION OF THE DRAWINGS

Embodiments of the present invention(s) are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the disclosure.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures.

The present invention provides a method for packaging an IC device in which the conventional manufacturing steps of mechanically bonding a die to a corresponding interconnecting substrate, electrically connecting the die to the substrate, and encapsulating the die in a protective molding compound are replaced by a single manufacturing step that includes thermally treating an appropriate assembly of parts to both (i) form proper electrical connections for the die in the resulting IC package and (ii) cause the molding compound(s) to encapsulate the die in a protective enclosure.

In one embodiment, the present invention is a packaged IC device, including a first package substrate; a second package substrate; a die attached at a first side thereof to the first package substrate and further attached at an opposite second side thereof to the second package substrate such that the die is positioned within an enclosure defined by the first and second package substrates; and a body of a molding compound encapsulating the die and securing the die to the first and second package substrates inside the enclosure.

In another embodiment, the present invention provides a method for packaging an IC device. The method includes the steps of: (a) placing a plurality of dies into a corresponding plurality of openings in a monolithic array of first package substrates covered by a first layer of molding compound; (b) placing a monolithic array of second package substrates covered by a second layer of molding compound over the monolithic array of the first package substrates with the plurality of dies thereon to form an assembly having enclosures for the dies, wherein a respective one of the first package substrates and a respective one of the second package substrates form a respective enclosure for a respective one of the dies; and (c) forming a monolithic array of IC devices by thermally treating the assembly to cause the first and second layers to form, for each of the dies, a respective body of molding compound that encapsulates the die and attaches the die to the respective one of the first package substrates and the respective one of the second package substrates inside the respective enclosure.

Figure 1:
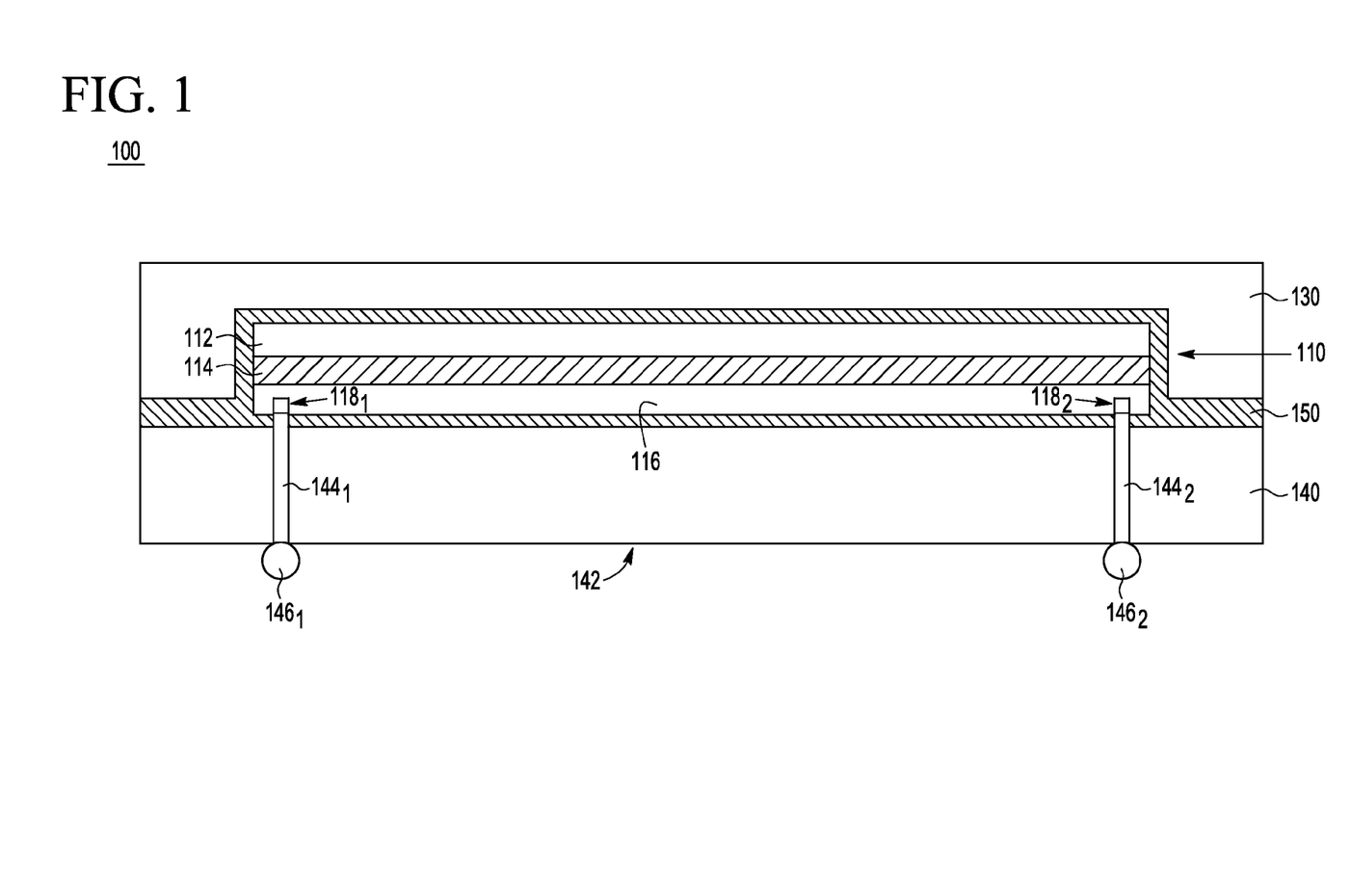
FIG. 1 shows a schematic cross-sectional side view of a packaged IC device according to an embodiment of the present invention.

Referring now to FIG. 1, a schematic cross-sectional side view of a packaged IC device 100 according to an embodiment of the present invention is shown. The IC device 100 includes a die 110 sandwiched in a monolithic clamshell arrangement between two package substrates 130 and 140, respectively. A body 150 of a molding compound fills up any gaps between the die 110 and the package substrates 130 and 140, thereby encapsulating the die 110 on all sides within the enclosure defined by the package substrates 130 and 140, as shown in FIG. 1. The body 150 also directly attaches or secures the package substrates 130 and 140 to one another outside the footprint of the die 110.

In an example embodiment, the die 110 includes a die substrate 112, a semiconductor-device layer 114, and a metal-interconnect structure 116. The device layer 114 and the metal-interconnect structure 116 may be fabricated, in a conventional manner, on a surface of the die substrate 112. In some embodiments, the electrical circuit implemented using the die 110 may be a microcontroller, a sensor, or a power controller, for example.

In an example embodiment, the package substrate 140 can be, e.g., of a laminate variety and include several tracking layers (not explicitly shown in FIG. 1) having metal tracks in each of them and metal vias configured to electrically connect different tracking layers to one another. Some of the metal vias in the package substrate 140 may be configured to each electrically connect a respective contact pad in the metal-interconnect structure 116 and a respective solder bump attached to an outer surface 142 of the package substrate 140. As an example, FIG. 1 shows two such metal vias, labeled $144_1$ and $144_2$, respectively and referred to herein collectively as vias 144. More specifically, each of metal vias 144 is configured to electrically connect a contact pad 118 in the metal-interconnect structure 116 and a solder bump 146 attached to the outer surface 142. One of ordinary skill in the art will appreciate that, in an alternative embodiment, the package substrate 140 may have many metal vias similar to the vias 144. In some embodiments, some other metal vias may be configured to each electrically connect a respective tracking layer in the package substrate 140 and a respective solder bump attached to the outer surface 142.

In alternative embodiments, other package-substrate types, such as various conventional BGA substrates, may similarly be used for the package substrate 140. For example, in some embodiments, the package substrate 140 may be or include a redistribution layer (RDL), an interposer, a laminate plate, a wire board, or a lead frame.

One of ordinary skill in the art will understand that, in some embodiments, in addition to the die 110, the package substrates 130, 140 may be configured to host one or more additional dies, e.g., in a manner similar to that of the die 110. In embodiments in which the IC device 100 has more than one die, the package substrate 140 may be configured to provide both intra-die and inter-die electrical connections.

Figure 2A:
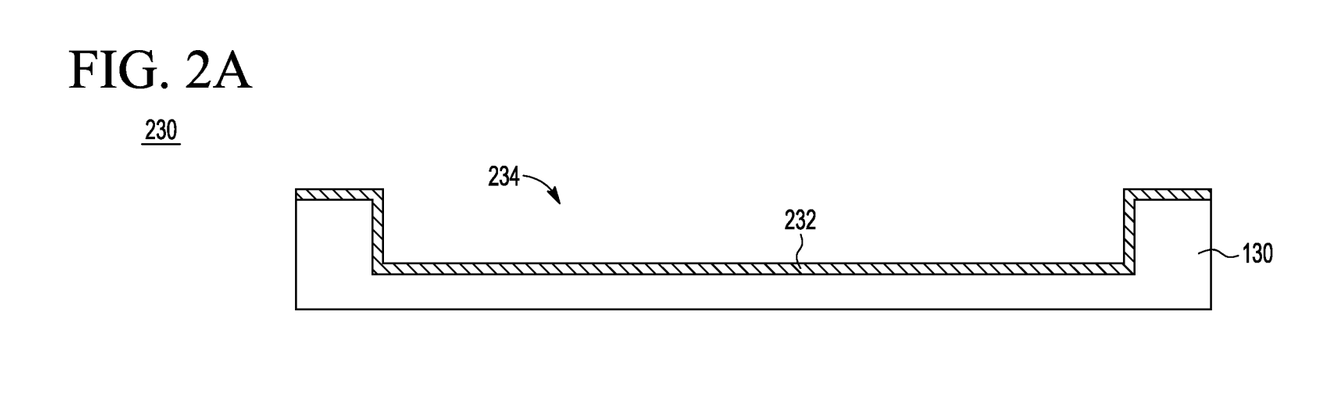
FIGS. 2A-2B show schematic cross-sectional side views of supply parts used in the assembly of the packaged IC device of FIG. 1 according to an embodiment of the present invention.
Figure 2B:
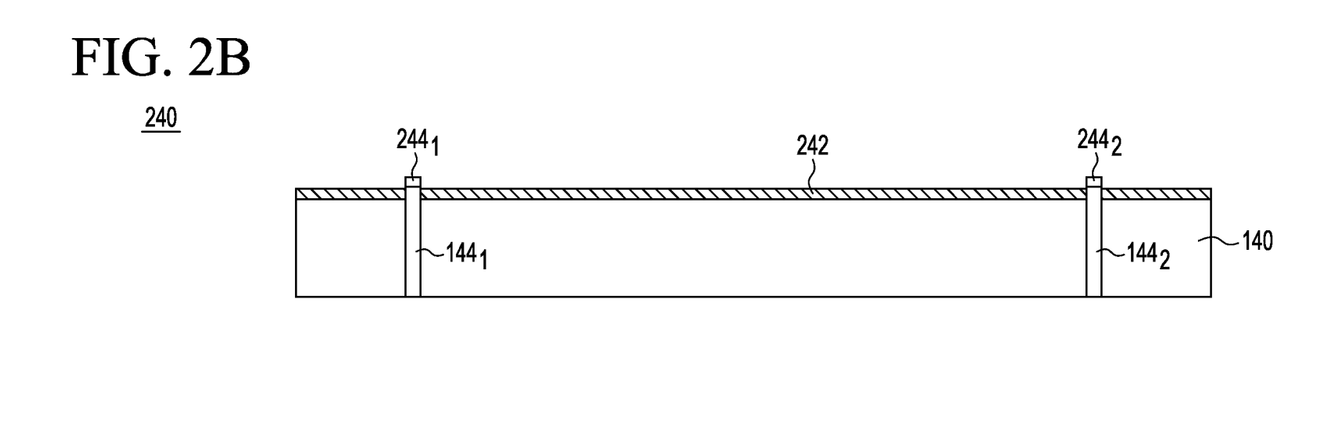

FIGS. 2A-2B show schematic cross-sectional side views of supply parts 230 and 240, respectively, that can be used in a manufacturing process of the IC device 100 (FIG. 1) according to an embodiment of the present invention.

Referring to FIG. 2A, the supply part 230 includes the package substrate 130 (FIG. 1) and a layer 232 of molding compound formed on or deposited over a surface of the package substrate 130 as indicated in FIG. 2A. The molding compound used for the layer 232 provides at least a portion of the molding compound for the body 150 (FIG. 1). After the layer 232 is deposited onto the package substrate 130, an opening 234 in the part 230 has a shape and dimensions that enable the opening to receive therein and accommodate in a relatively tight manner the die 110 (FIG. 1). For example, in one embodiment, the depth of the opening 234, as measured from the top of the layer 232 at an edge of the opening 234 (see FIG. 2A), is substantially equal to the thickness of the die 110. Similarly, the footprint of the opening 234 may be substantially the same (within the accepted tolerances) as the footprint of the die 110.

Referring to FIG. 2B, the part 240 includes the package substrate 140 (FIG. 1). The part 240 further includes a layer 242 of molding compound formed on or deposited over a surface of the package substrate 140 as indicated in FIG. 2B. The molding compound used for the layer 242 provides the remaining portion of the molding compound for the body 150 (FIG. 1). In one embodiment, the layers 232 (FIG. 2A) and 242 (FIG. 2B) are made of the same molding compound. In an alternative embodiment, the layers 232 (FIG. 2A) and 242 (FIG. 2B) may be made of different molding compounds.

The ends of the metal vias 144 may protrude through the layer 242 as indicated in FIG. 2B. A portion of the metal via 144 that extends beyond the layer 242 may be covered by a cap 244 made of a suitable thermally pliable, electrically conductive material. In an example embodiment, the material of the caps 244 is selected such that this material can be reshaped, e.g., by the application of heat and external mechanical force, to cause the caps 244 to attach to the corresponding contact pads 118 of the metal-interconnect structure 116 of the die 110 to form good electrical connections between the corresponding electrically conducting vias and the contact pads. For example, the material of caps 244 may be selected such that these good electrical connections are formed at a temperature that is sufficiently close to the temperature at which the molding compound of the layers 232 and 234 is molded during the manufacturing process of the IC device 100 (FIG. 1). In terms of the geometric shape, the caps 244 may be configured to be substantially complementary to the surface topology of and/or near to the contact pads 118 in the metal-interconnect structure 116 to which the metal vias 144 are electrically connected for proper operation of the IC device 100.

FIGS. 3-9 pictorially illustrate a manufacturing or assembly method that can be used in the production of the IC device 100 (FIG. 1) according to an embodiment of the invention. The manufacturing method shown in FIGS. 3-9 enables batch production of the IC device 100 using suitable supply parts as further detailed below. Solely for illustration purposes, the manufacture of four instances (copies) of the IC device 100 is shown in FIGS. 3-9. One of ordinary skill in the art will understand that a different (from four) number of instances of the IC device 100 can be simultaneously assembled in a similar manner in a one- or two-dimensional array.

Figure 3:
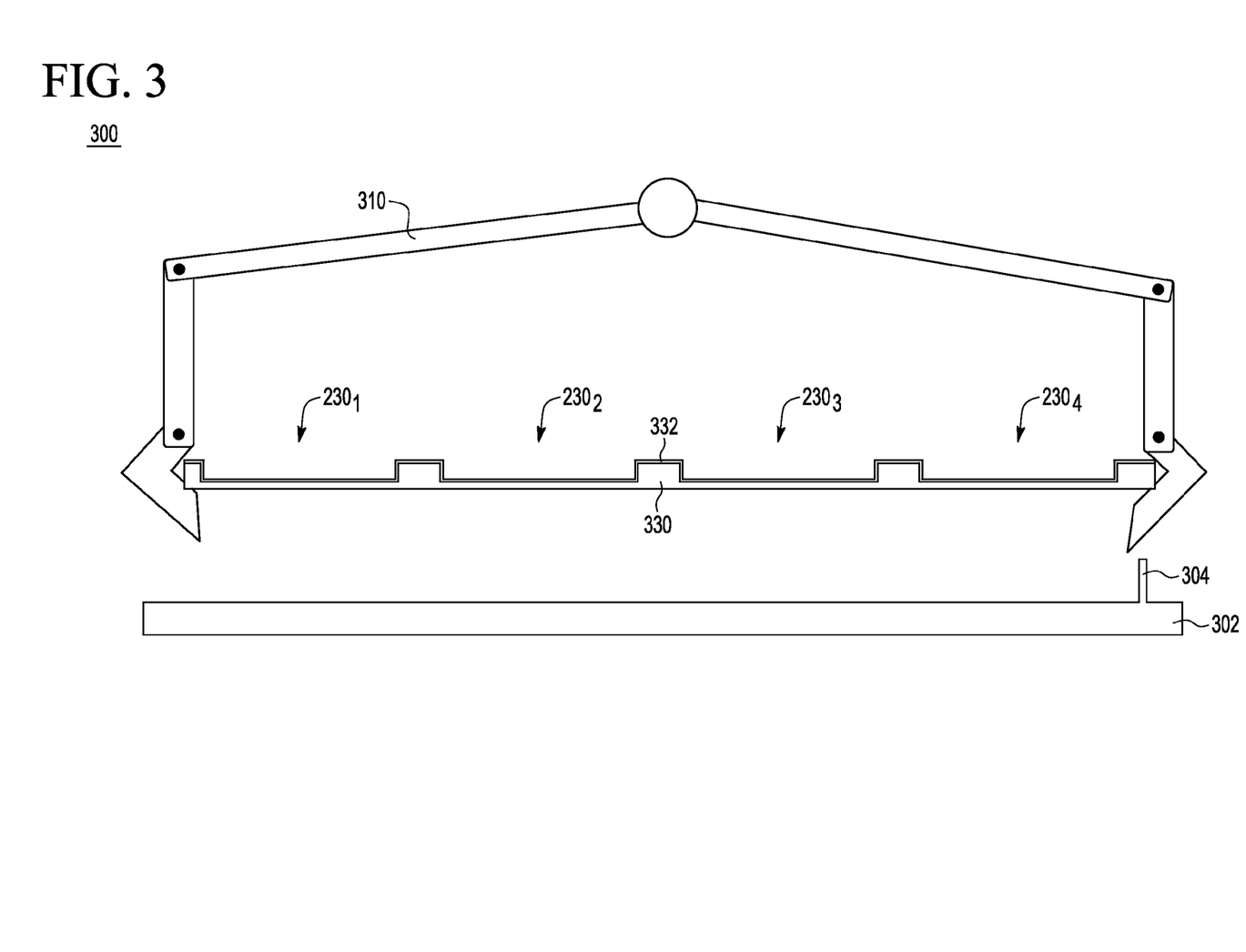
FIGS. 3-9 pictorially illustrate a manufacturing method that can be used in the production of the packaged IC device of FIG. 1 according to an embodiment of the present invention.

FIG. 3 pictorially illustrates step 300 of the manufacturing method according to an embodiment of the invention. Step 300 uses a monolithic array 330 of the parts 230 (FIG. 2A). In the embodiment shown in FIG. 3, the monolithic array 330 is shown as comprising four instances of the part 230, labeled $230_1$-$230_4$. The monolithic array 330 can be manufactured, e.g., using a wafer containing multiple instances (copies) of the package substrate 130 and then depositing over that wafer a layer 332 of molding compound. Different portions of the layer 332 then represent respective layers 232 of the parts $230_1$-$230_4$.

Figure 6A:
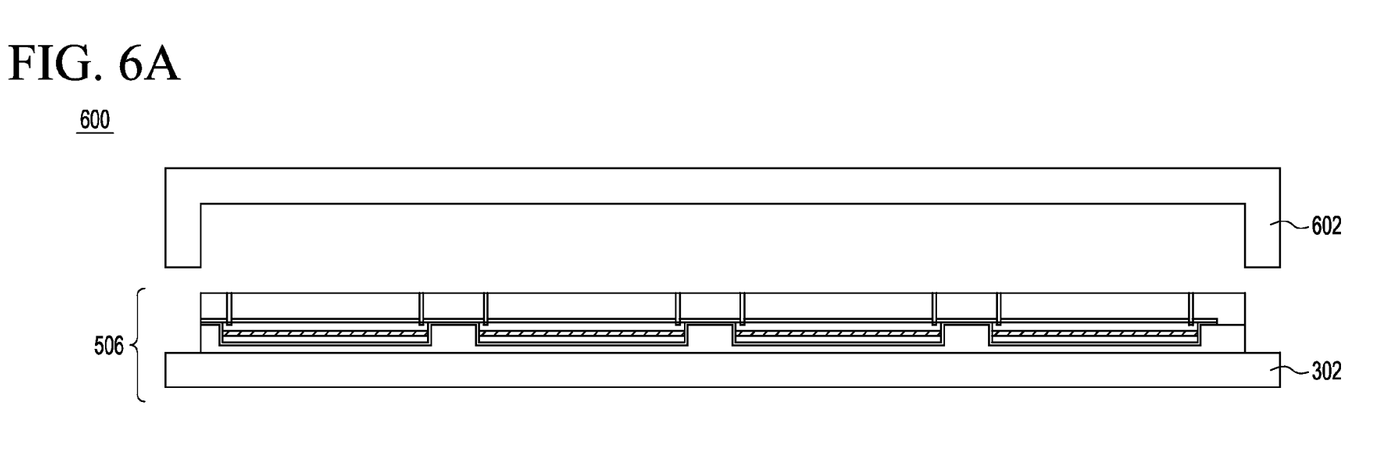
Figure 6B:
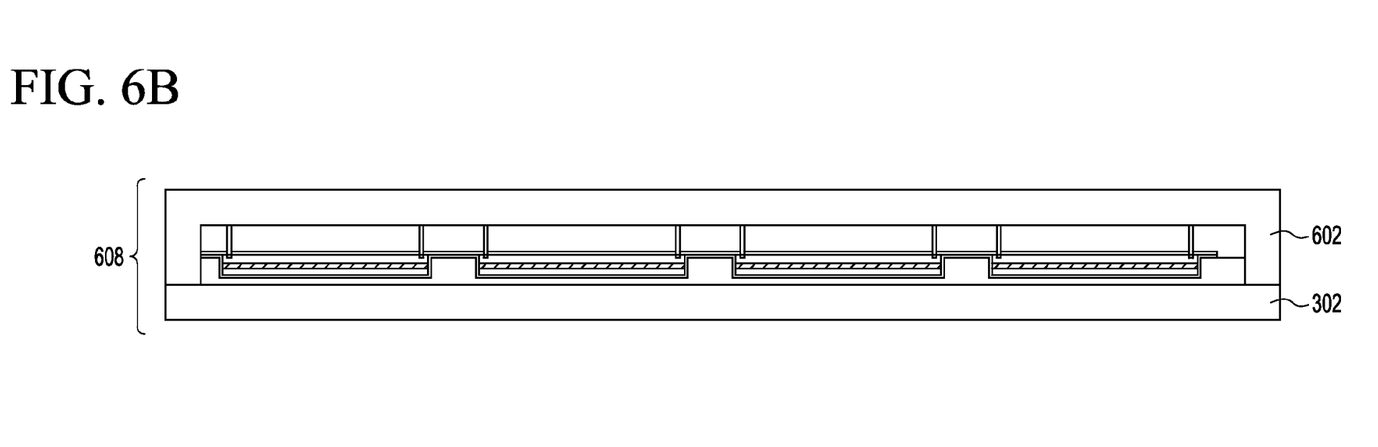

Step 300 also uses a base 302 of a mold form (also see FIGS. 6A-6B). A mechanical arm 310 is operated to place the monolithic array 330 onto a surface of the base 302 such that a location pin 304 attached to the base 304 is inserted into a corresponding hole (not explicitly shown in FIG. 3) in the monolithic array 330 to properly position the monolithic array 330 on the surface of the base 304. In some embodiments, more than one location pin similar to the location pin 302 may be used for this purpose.

Figure 4A:
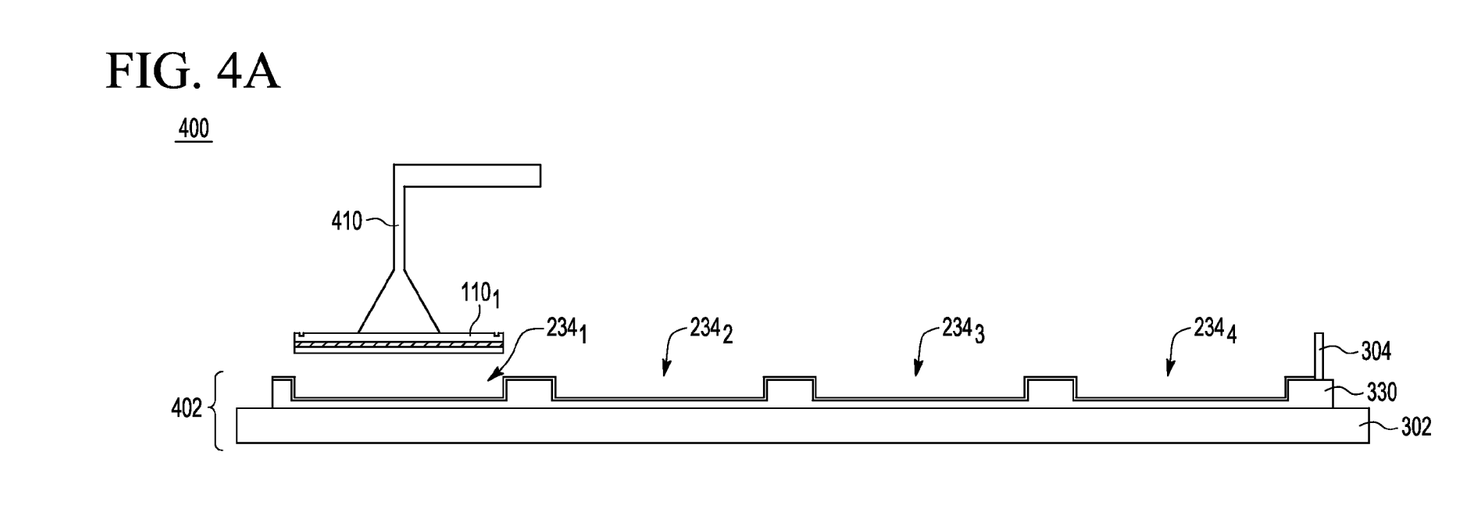
Figure 4B:
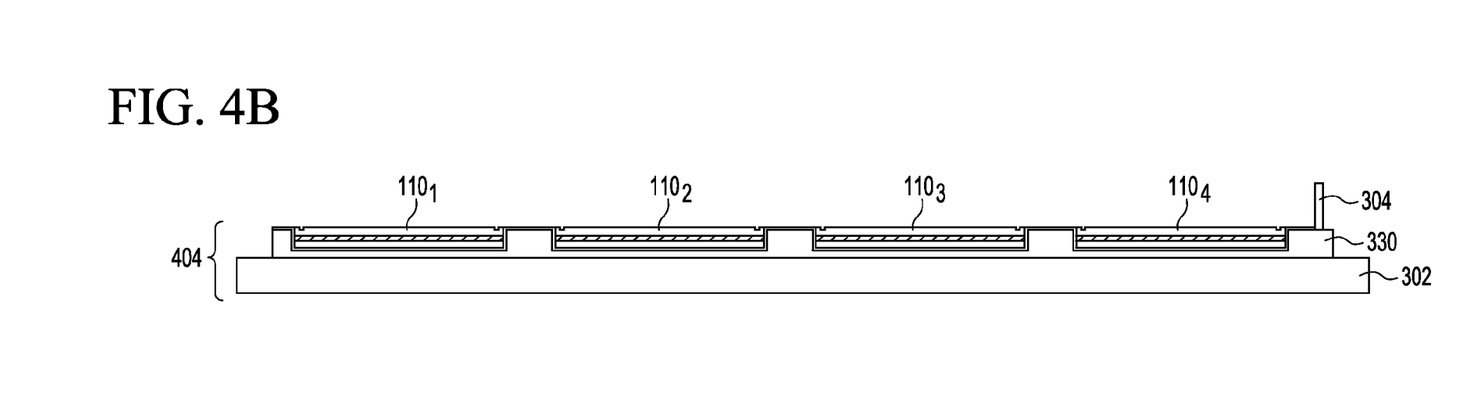

FIGS. 4A-4B pictorially illustrate step 400 of the manufacturing method according to an embodiment of the invention. At step 400, an assembly 402 (see FIG. 4A) produced at step 300 (FIG. 3) is used to produce an assembly 404 shown in FIG. 4B. More specifically, a suction arm 410 shown in FIG. 4A may be operated to place four instances of the die 110, labeled $110_1$-$110_4$, into openings $234_1$-$234_4$ of the parts $230_1$-$230_4$, respectively, in the monolithic array 330. For example, FIG. 4A shows the placement of the die $110_1$ into the opening $234_1$ in the monolithic array 330. The dies $110_2$-$110_4$ can be placed into the openings $234_2$-$234_4$ in a similar manner to arrive at the assembly 404 (FIG. 4B).

Figure 5A:
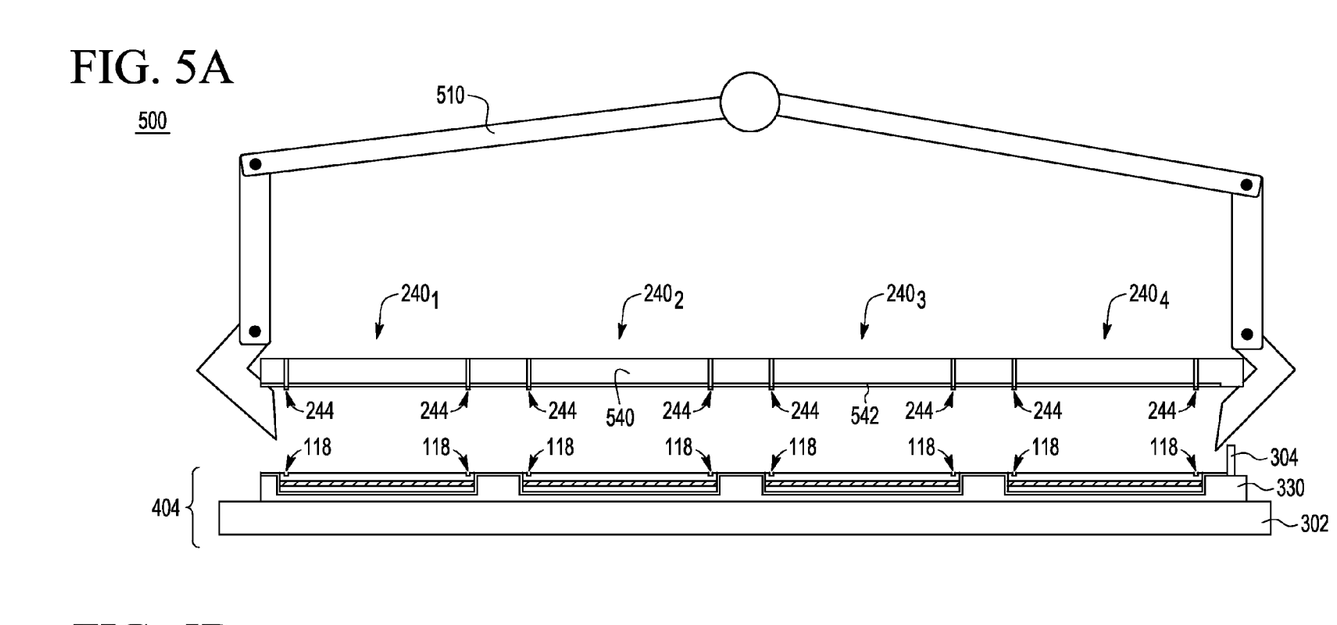
Figure 5B:
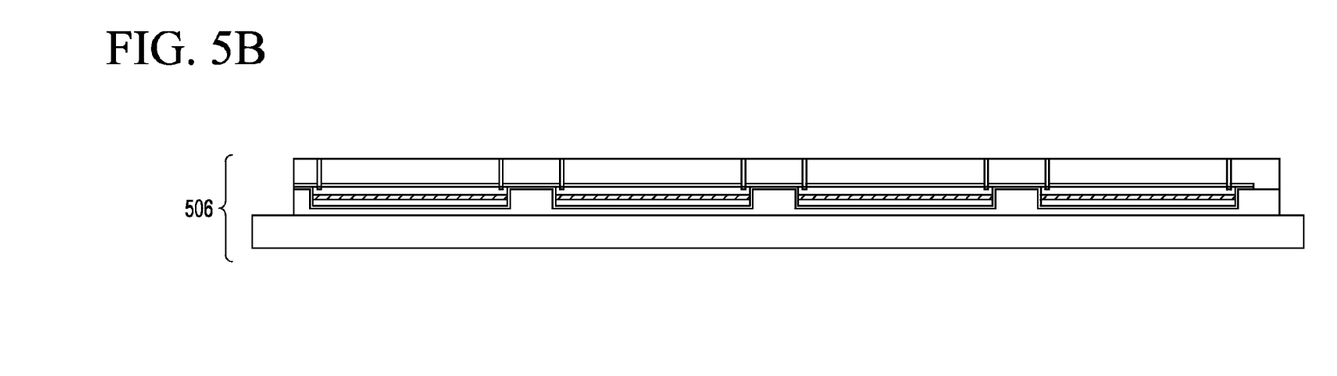

FIGS. 5A-5B pictorially illustrate step 500 of the manufacturing method according to an embodiment of the invention. Step 500 uses a monolithic array 540 of the parts 240 (FIG. 2B). In the embodiment shown in FIGS. 5A-5B, the monolithic array 540 comprises four instances of the part 240, labeled $240_1$-$240_4$. As such, the monolithic array 540 matches and is geometrically complementary to the monolithic array 330 used at step 300 (FIG. 3). The monolithic array 540 can be manufactured, e.g., using a wafer containing multiple instances (copies) of the package substrate 140 and then depositing over that wafer a layer 542 of a molding compound. Different portions of the layer 542 then represent respective layers 242 of the parts $240_1$-$240_4$.

A mechanical arm 510 is operated to place the monolithic array 540 onto a surface of the assembly 404 as indicated in FIG. 5A. During this placement, the location pin 304 is inserted into a corresponding hole (not explicitly shown in FIG. 5A) in the monolithic array 540 to guide the monolithic array 540 into place on the surface of the assembly 404, thereby creating an assembly 506 shown in FIG. 5B. Also note that, upon said placement, the caps 244 of the monolithic array 540 are positioned next to the corresponding contact pads 118 of the dies 110 in the assembly 404 (also see FIGS. 1 and 2B).

FIGS. 6A-6B pictorially illustrate step 600 of the manufacturing method according to an embodiment of the invention. At step 600, a cover 602 of the mold form is placed onto the assembly 506, e.g., as indicated in FIG. 6A. The cover 602 is then clamped (not shown) to the base 302 to arrive at an assembly 608 shown in FIG. 6B. As indicated in FIG. 6B, the dies $110_1$-$110_4$ and the monolithic arrays 330 and 540 in the assembly 608 are properly aligned with each other and enclosed within the mold form, which includes the base 302 and the cover 602.

The assembly 608 is then transferred into an oven, where it is heated to an appropriate temperature at which thermosetting reactions can occur in the layers 332 and 542 and in the caps 244. The thermosetting reactions cause (i) layers 332 and 542 to fuse together and (ii) monolithic arrays 330 and 540 and dies 110 to become tightly bound to one another to form a single substantially monolithic piece. The thermosetting reactions also cause the caps 244 to form good electrical connections with the corresponding contact pads 118, thereby reliably electrically connecting the latter with the corresponding metal vias 144 (also see FIGS. 1 and 2B).

Figure 7A:
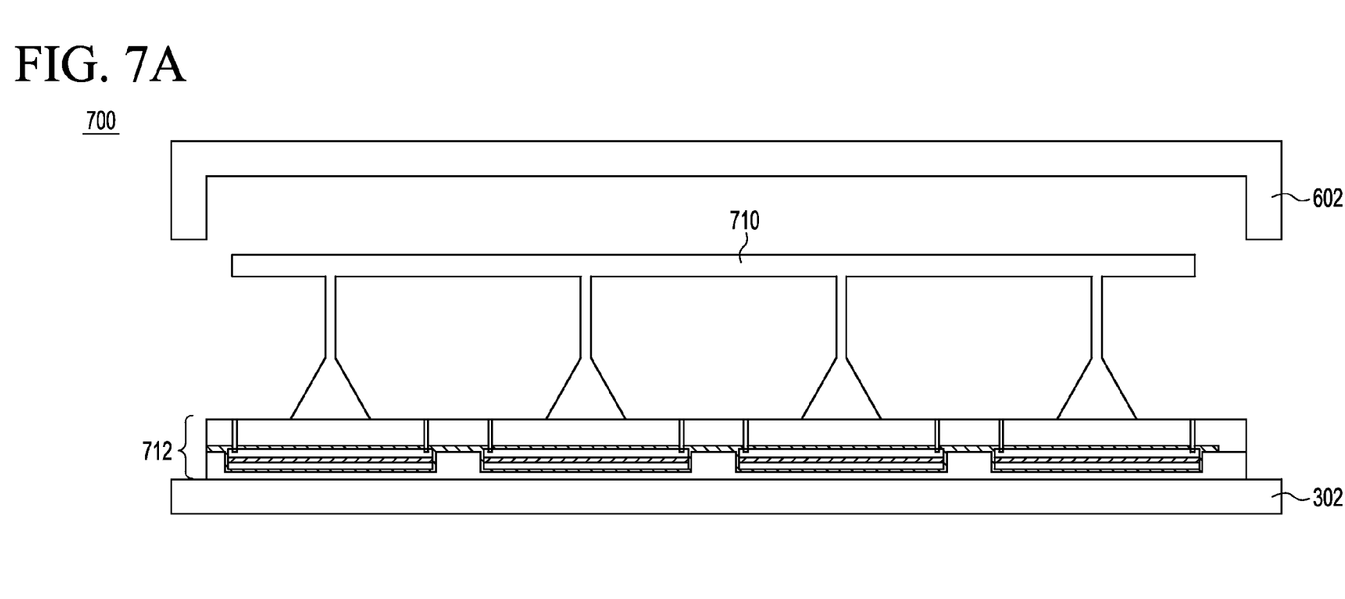
Figure 7B:
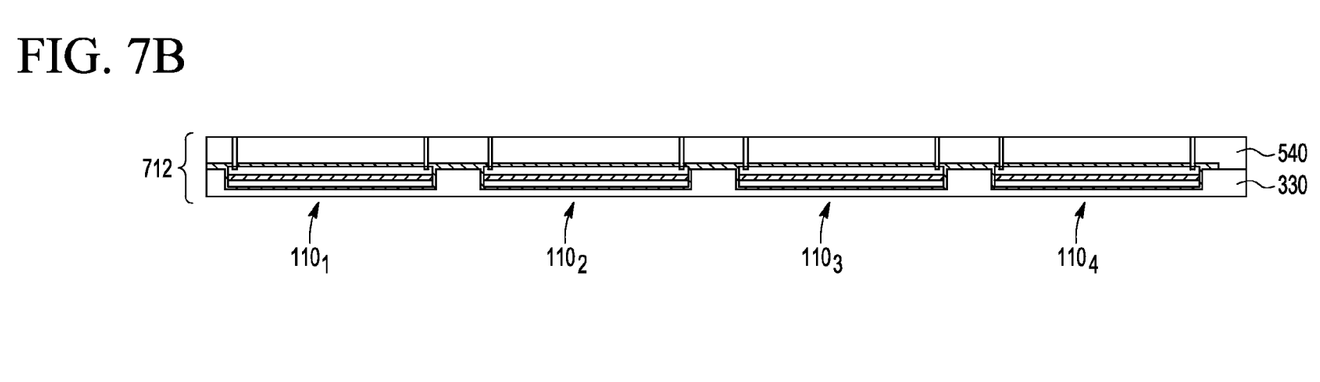

FIGS. 7A-7B pictorially illustrate step 700 of the manufacturing method according to an embodiment of the invention. At step 700, the mold form is unclamped and disassembled, e.g., by removing the 602 from the base 302, as indicated in FIG. 7A. A suction arm 710 is then used to remove from the base 302 a monolithic array 712 that has formed in the course of the thermosetting reactions of step 600. As indicated above, the monolithic array 712 comprises the monolithic arrays 330 and 540 and the dies 110 bound to each other (see FIG. 7B).

Figure 8:
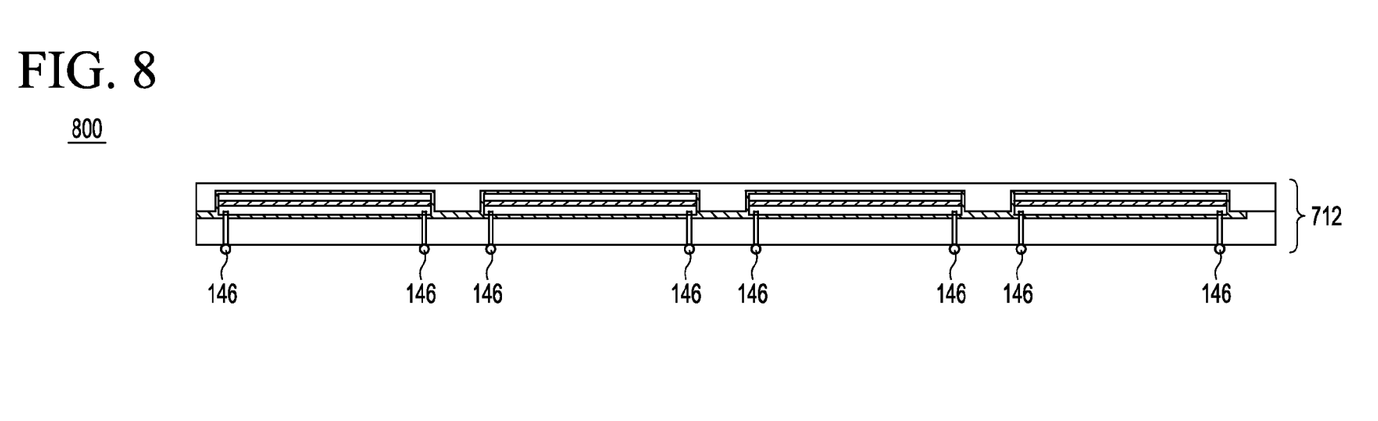

FIG. 8 pictorially illustrates step 800 of the manufacturing method according to an embodiment of the invention. At step 800, solder bumps 146 are attached to the monolithic array 712 at the appropriate locations.

Figure 9:
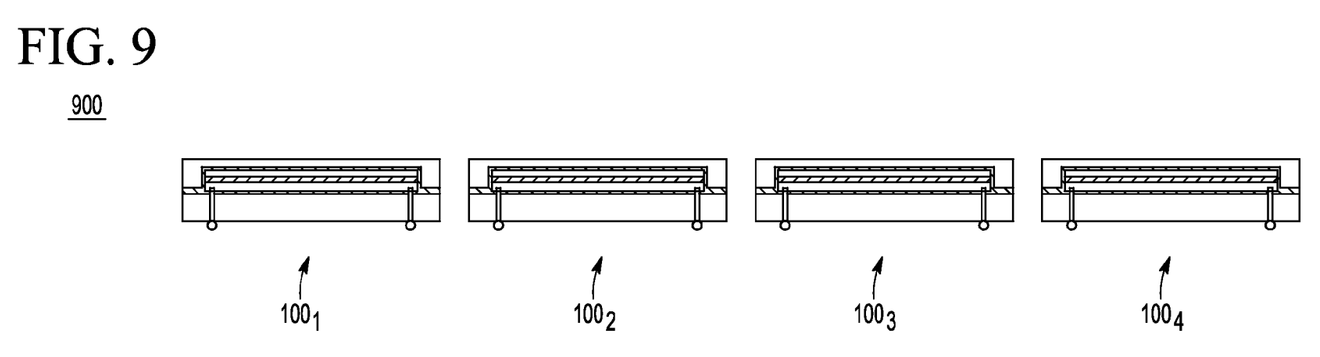

FIG. 9 pictorially illustrates step 900 of the manufacturing method according to an embodiment of the invention. At step 900, the monolithic array 712 having the attached solder bumps 146 is separated (i.e., singulated) into four instances (copies) of the IC device 100, labeled $100_1$-$100_4$. In one embodiment, this separation can be achieved, e.g., by sawing the monolithic array 712 into appropriate pieces.

According to an example embodiment disclosed above in reference to FIGS. 1-9, provided is a packaged IC device (e.g., 100, FIG. 1), comprising: a first package substrate (e.g., 130, FIG. 1); a second package substrate (e.g., 140, FIG. 1); a die (e.g., 110, FIG. 1) attached at a first side thereof to the first package substrate and further attached at an opposite second side thereof to the second package substrate, wherein the die is positioned within an enclosure defined by the first package substrate and the second package substrate; and a body (e.g., 150, FIG. 1) of a molding compound encapsulating the die and attaching the die to the first and second package substrates inside the enclosure.

In some embodiments of the packaged IC device, the body fills up gaps between the die and the first and second package substrates inside the enclosure.

In some embodiments of any of the above packaged IC devices, the body comprises a layer of the molding compound that directly attaches the first and second package substrates to one another outside a footprint of the die.

In some embodiments of any of the above packaged IC devices, the second package substrate comprises a plurality of electrically conducting vias (e.g., 144, FIG. 1), each configured to electrically connect the die to a respective solder bump (e.g., 146, FIG. 1) attached to an outer surface (e.g., 142, FIG. 1) of the second package substrate.

In some embodiments of any of the above packaged IC devices, the body comprises: a first layer (e.g., 232, FIG. 2A) that attaches the first side of the die to the first package substrate, said first layer comprising a first molding compound; and a second layer (e.g., 242, FIG. 2B) that attaches the second side of the die to the second package substrate, said second layer comprising a second molding compound different from the first molding compound.

In some embodiments of any of the above packaged IC devices, the packaged IC device further comprises a plurality of solder bumps (e.g., 146, FIG. 1) connected to the substrate for mounting the packaged IC device on a circuit board.

According to another example embodiment disclosed above in reference to FIGS. 1-9, provided is a method for packaging an IC device (e.g., 100, FIG. 1), the method comprising the steps of: (A) placing (e.g., 400, FIG. 4) a plurality of dies (e.g., $110_1$-$110_4$, FIG. 4) into a corresponding plurality of openings (e.g., $234_1$-$234_4$, FIG. 4) in a monolithic array (e.g., 330, FIGS. 3 and 4A) of first package substrates (e.g., $230_1$-$230_4$, FIGS. 3 and 4A) covered by a first layer (e.g., 332, FIG. 3) of a molding compound; (B) placing (e.g., 500, FIG. 5) a monolithic array (e.g., 540, FIG. 5) of second package substrates (e.g., $240_1$-$240_4$, FIG. 5) covered by a second layer (e.g., 542, FIG. 5) of a molding compound over the monolithic array of the first package substrates with the plurality of dies thereon to form an assembly (e.g., 608, FIG. 6) having enclosures for the dies, wherein a respective one of the first package substrates and a respective one of the second package substrates form a respective enclosure for a respective one of the dies; and (C) forming a monolithic array (e.g., 712, FIG. 7) of IC devices by thermally treating the assembly to cause the first and second layers to form, for each of the dies, a respective body (e.g., 150, FIG. 1) of a molding compound that encapsulates the die and attaches the die to the respective one of the first package substrates and the respective one of the second package substrates inside the respective enclosure.

In some embodiments of the above method, the method further comprises the step of (D) attaching (e.g., 800, FIG. 8) a plurality of solder bumps (e.g., 146, FIGS. 1 and 8) to the second package substrate to configure the packaged IC device for mounting on a circuit board.

In some embodiments of any of the above methods, the method further comprises the step of (E) separating (e.g., 900, FIG. 9) the monolithic array of IC devices having the plurality of solder bumps attached thereto into individual IC devices.

In some embodiments of any of the above methods, the second package substrate comprises a plurality of electrically conducting vias (e.g., 144, FIG. 1), each having a thermally pliable cap (e.g., 244, FIG. 2B) that extends beyond the second layer; and the thermal treatment of step (C) causes each of the thermally pliable caps to attach to a corresponding contact pad in the die to form an electrical connection between the corresponding electrically conducting via and said contact pad.

In some embodiments of any of the above methods, each of the dies comprises a die substrate (e.g., 112, FIG. 1), a semiconductor-device layer (e.g., 114, FIG. 1) formed on the die substrate, and a metal-interconnect structure (e.g., 116, FIG. 1) formed on the semiconductor-device layer; and the metal-interconnect structure includes one or more of the corresponding contact pads.

In some embodiments of any of the above methods, the thermal treatment of step (C) causes each of the respective bodies to fill up gaps between the respective die and the respective first and second package substrates inside the respective enclosure.

In some embodiments of any of the above methods, the thermal treatment of step (C) causes the first and second layers to fuse and directly attach the monolithic array of first package substrates and the monolithic array of second package substrates to one another outside footprints of the dies.

In some embodiments of any of the above methods, the first layer comprises a first molding compound; and the second layer comprises a second molding compound different from the first molding compound.

Exemplary embodiments have been provided where the embodiments relate to BGA packages. The invention, however, is not limited to BGA packages. Alternative embodiments may comprise other similar IC packages such as pin grid array (PGA) and land grid array (LGA) packages.

It will be further understood that various changes in the details, materials, and arrangements of the parts which have been described and illustrated in order to explain the nature of this invention may be made by those skilled in the art without departing from the scope of the invention as expressed in the following claims.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Unless explicitly stated otherwise, each numerical value and range should be interpreted as being approximate as if the word "about" or "approximately" preceded the value of the value or range. As used in this application, unless otherwise explicitly indicated, the term "connected" is intended to cover both direct and indirect connections between elements.

For purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. The terms "directly coupled," "directly connected," etc., imply that the connected elements are either contiguous or connected via a conductor for the transferred energy.

The use of figure numbers and/or figure reference labels in the claims is intended to identify one or more possible embodiments of the claimed subject matter in order to facilitate the interpretation of the claims. Such use is not to be construed as limiting the scope of those claims to the embodiments shown in the corresponding figures.

Although the steps in the following method claims are recited in a particular sequence with corresponding labeling, unless the claim recitations otherwise imply a particular sequence for implementing some or all of those steps, those steps are not necessarily intended to be limited to being implemented in that particular sequence.

The invention claimed is:

1. A packaged integrated circuit (IC) device, comprising:
    a first package substrate;
    a second package substrate;
    a die attached at a first side thereof to the first package substrate and further attached at an opposite second side thereof to the second package substrate, wherein the die is positioned within an enclosure defined by the first package substrate and the second package substrate; and
    a body of a molding compound encapsulating the die and attaching the die to the first and second package substrates inside the enclosure, wherein the body comprises:
        a first layer that attaches the first side of the die to the first package substrate, said first layer comprising a first molding compound; and
        a second layer that attaches the second side of the die to the second package substrate, said second layer comprising a second molding compound different from the first molding compound.

2. The packaged IC device of claim 1, wherein the body fills up gaps between the die and the first and second package substrates inside the enclosure.

3. The packaged IC device of claim 1, wherein the body comprises a layer of the molding compound that directly attaches the first and second package substrates to one another outside a footprint of the die.

4. The packaged IC device of claim 1, wherein the second package substrate comprises a plurality of electrically conducting vias, each configured to electrically connect the die to a respective solder bump attached to an outer surface of the second package substrate.

5. The packaged IC device of claim 1, further comprising a plurality of solder bumps connected to the substrate for electrically connecting the packaged IC device on a circuit board.

\* \* \* \* \*